United States Patent [19]

Ueki et al.

[11] Patent Number: 5,084,627
[45] Date of Patent: Jan. 28, 1992

[54] SHEET DETECTING DEVICE FOR USE IN AN IMAGE FORMING DEVICE FOR DETECTING PRESENCE OR ABSENCE OF A SHEET, A RIGHT OR WRONG SIDE OF A SHEET AND THE KIND OF SHEET

[75] Inventors: Yoshiharu Ueki, Nara; Fumio Shimazu, Yamatokooriyama; Akira Tamagaki, Souraku, all of Japan

[73] Assignee: Sharp Kabushiki Kaisha, Osaka, Japan

[21] Appl. No.: 523,572

[22] Filed: May 15, 1990

[30] Foreign Application Priority Data

May 16, 1989 [JP] Japan ................... 1-124035

[51] Int. Cl.⁵ ..................... G01N 21/86; G01N 9/04
[52] U.S. Cl. ................... 250/561; 250/223 R
[58] Field of Search ............ 250/223 R, 561, 559, 250/571; 356/448, 445, 429, 430

[56] References Cited

U.S. PATENT DOCUMENTS

| | | | |
|---|---|---|---|
| 3,932,755 | 1/1976 | Sagawa | 250/559 |
| 4,284,356 | 8/1981 | Heilman | 250/559 |
| 4,691,100 | 9/1987 | Kizu et al. | 250/561 |
| 4,723,072 | 2/1988 | Naruse | 250/559 |
| 4,983,854 | 1/1991 | Mizuno et al. | 250/223 R |

FOREIGN PATENT DOCUMENTS 61-72612  5/1986  Japan .

*Primary Examiner*—David C. Nelms
*Assistant Examiner*—Michael Messinger

[57] ABSTRACT

A sheet detecting device has a pair of first and second reflection type photosensors in both sides of upper and lower guide members of a sheet carrying path. A reflector member is disposed in the lower guide member facing to the first reflection type photosensor and a comparator for comparing the output signal of the first reflection type photosensor with a predetermined reference value which is used when an image receiving sheet is not fed in the sheet detecting device. The difference between the reflectances of the right side and wrong side of the sheet fed in the sheet detecting device is detected by the first and second reflection type photosensors, so that information of the image receiving sheet is obtained.

6 Claims, 7 Drawing Sheets

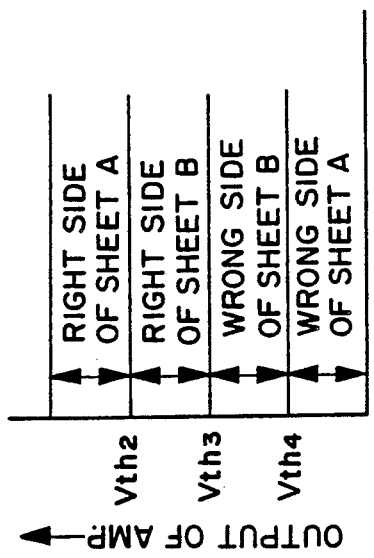
Fig. 4
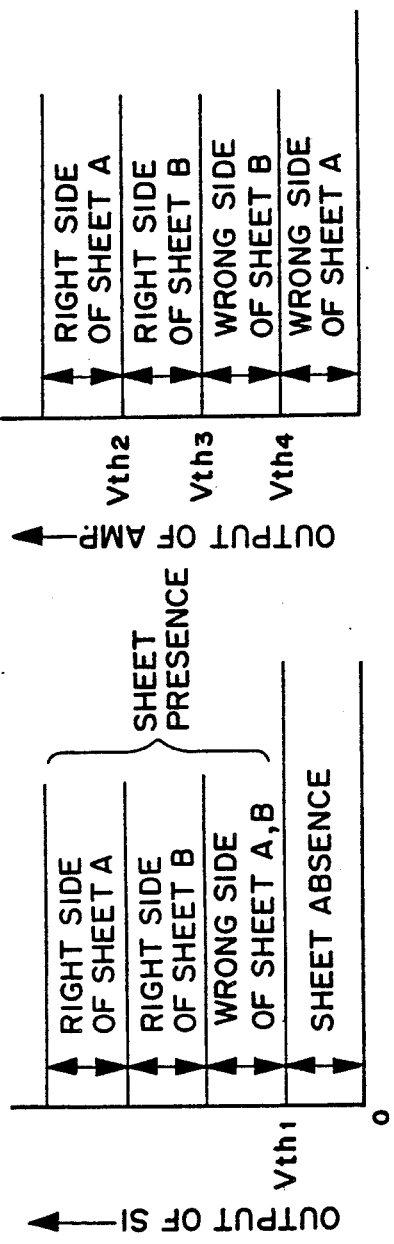
Fig. 5
Fig. 6
| V1 | V2 | V3 | V4 | JUDGMENT |
|---|---|---|---|---|
| L | X | X | X | SHEET ABSENCE |
| H | H | H | H | RIGHT SIDE OF SHEET A |
| H | L | H | H | RIGHT SIDE OF SHEET B |
| H | L | L | H | WRONG SIDE OF SHEET B |
| H | L | L | L | WRONG SIDE OF SHEET A |
H : high level
L : low level
X : any level

SHEET DETECTING DEVICE FOR USE IN AN IMAGE FORMING DEVICE FOR DETECTING PRESENCE OR ABSENCE OF A SHEET, A RIGHT OR WRONG SIDE OF A SHEET AND THE KIND OF SHEET

BACKGROUND OF THE INVENTION

1. Field of the Invention

The present invention relates to a sheet detecting device, in particular to a sheet detecting device for detecting presence or absence of a printing sheet, a right side or wrong side of a printing sheet set in an image forming device or the like and for detecting the kind of the printing sheet to be fed in the sheet detecting device along a sheet carrying path for use in the image forming device or the like.

2. Description of the Prior Art

In an image forming device of a photosensitive and pressure sensitive type which has been developed in recent years, there has been used a copying sheet with resin material or the like coated thereon for printing a copying image. For example, there is used a photosensitive sheet of which the right side surface is coated with microcapsules containing light hardener materials and image forming materials. At the same time of this, there is also used an image receiving sheet of which the right side surface is coated with color developer for coloring the image receiving sheet by reaction with the image forming material and is coated with thermoplastic resin together with the photosensitive sheet. In the case of using such a pair of image receiving sheet and photosensitive sheet, the pressure developing process is carried out by piling up the image forming sheet with the photosensitive sheet in such a manner that the coated surface of the imaging sheet is faced to the coated surface of the photosensitive sheet. Therefore, it is an important matter that the image receiving sheet is carried along the sheet carrying path with its right side and wrong side surfaces correctly set.

Therefore, generally in such an image forming device as described above, a pair of sensors for example, are provided in front of a timing roller for feeding an image receiving sheet to a pressure developing process, thereby judging whether or not the right side and wrong side are correctly set so as to judge the kind of the sheet. As a method of judgment of the right side and wrong side of the image receiving sheet, for example, there are provided a pair of reflection type photosensors in both of the upper and lower sides of the sheet carrying path so as to detect the reflectances of the light reflected by the right side and wrong side of the sheet, thereby judging the right side and wrong side of the sheet by detecting the difference between the reflectances of the right side and wrong side of the sheet.

Moreover, in such an image forming device of a photosensitive and pressure sensitive type as described above, if the pressure developing process is carried out under the condition that there is not fed an image receiving sheet, the microcapsules coated on the surface of the photosensitive sheet are broken so that the image forming materials contained in the microcapsules flow out so as to stain a press roller. Consequently, the quality of the image is deteriorated in the subsequent image forming operation due to a stain on the image receiving sheet with the image forming materials. That is the reason why it is necessary to detect presence or absence of an image receiving sheet, and in general, by providing another sensor in front of the timing roller on the sheet carrying path other than a pair of sensors as mentioned above, it has been judged whether an image receiving sheet is present or absent.

Consequently, a sensor is required for judging presence or absence of an image receiving sheet other than the sensors for judging the right side and wrong side and the kind of the image receiving sheet in a narrow space defined between the sheet feeding roller and the timing roller, so that the arrangement of the sensors is complicated and there has been a problem that the cost of the device is raised due to the increment of the space for accommodating the sensors and the increment of the parts thereof.

SUMMARY OF THE INVENTION

In order to solve the problem mentioned above, the present invention has been made and has its essential object to provide a sheet detecting device with a simple structure and a small space for detecting a right side or wrong side and a kind of an image receiving sheet to be fed along a sheet carrying path, which is used as a detecting device for detecting the presence or absence of the image receiving sheet as well.

According to a first feature of the present invention, in a sheet detecting device for detecting a right side or wrong side and a kind of an image receiving sheet fed in the sheet detecting device along a sheet carrying path and for detecting presence or absence of an image receiving sheet to be fed in the sheet detecting device, there are provided a pair of light reflection type photosensors in both sides of upper and lower guide members of the sheet carrying path, so that the information of the image receiving sheet is obtained by detecting the difference between the reflectances of the right side and wrong side of the sheet to be fed in the sheet detecting device along the sheet carrying path detected by the pair of light reflection type photosensors. The sheet detecting device comprises, a reflector member having a reflectance smaller than the smallest reflectance of those of the right and wrong sides of the image receiving sheet to be fed along the sheet carrying path, said reflector member being disposed on a predetermined portion in one of the guide members of the sheet carrying path facing to one of said pair of reflection type photosensors, and comparator means for comparing the output signal of the reflection type photosensor disposed in the side of the guide member facing to the reflector member with a predetermined reference value which is used when an image receiving sheet is not fed in the sheet detecting device.

According to a second feature of the present invention, in a sheet detecting device for detecting a right side or wrong side and a kind of an image receiving sheet fed in a sheet carrying path and for detecting presence or absence of an image receiving sheet to be fed in the sheet carrying path, there are provided a pair of light reflection type photosensors on both sides of the sheet carrying path and the information of the image receiving sheet is obtained by detecting the difference between the reflectances of the right side and wrong side of the sheet to be carried along the sheet carrying path by means of the pair of reflection type photosensors. The sheet detecting device comprises two reflectors on the surfaces of the sheet carrying path respectively opposing to said pair of reflection type photosensors disposed on the sheet carrying path, wherein the difference between the reflectances of the two reflectors is made larger than the largest difference between the reflectances of the right and wrong sides of the sheet to be carried along the sheet carrying path.

In the first feature of the sheet detecting device of the present invention, when the sheet does not reach to a position corresponding to the pair of reflection type photosensors provided on both sides of the sheet carrying path, one of the reflection type photosensors detects the small reflectance of the reflector provided on a side portion opposing to the reflection type photosensor. When the sheet reaches to the position between the reflection type photosensors, one of the reflection type photosensors mentioned above detects the reflectance of the right side of the sheet and the other reflection type photosensor detects the reflectance of the wrong side of the same sheet. First, only the output of the reflection type photosensor detecting the reflectance of the right side mentioned above is compared with the predetermined reference value in a state that the sheet is not fed in the sheet carrying path by means of a comparator. As described above, in the case the small reflectance of the reflector of small reflectance is detected, the detected reflectance is smaller than the predetermined reference value, so that it is judged that there is not fed a sheet (sheet absent state). In the case of detecting the reflectance of the right side or wrong side of the sheet, the detected reflectance is larger than the reference value, so that it is judged that there is fed a sheet (sheet present state). At the same time of this, the difference between the reflectance detected by the above mentioned one of the reflection type photosensors and the reflectance detected by the other reflection type photosensor is compared with the respective reference values set in accordance with the difference between the reflectances of the right side and the wrong side of the sheet to be used, whereby the right side and wrong side and the kind of the sheet are detected.

In the second feature of the sheet detecting device according to the present invention, when the sheet does not reach to the position between said pair of reflection type photosensors provided on both sides of the sheet carrying path, the respective reflection type photosensors detect the reflectances of the reflectors opposing thereto respectively. The difference between the reflectances of the two reflectors is made larger than the largest difference between the reflectances of the right side and wrong side of the sheet to be fed in the sheet carrying path. When the sheet reaches to the position between the pair of photosensors, the two photosensors detect the reflectances of the right and wrong sides of the sheet respectively. The presence or absence, the kind and the right and wrong sides of the sheet are judged by comparing the difference between the reflectances of the right and wrong sides of the sheet detected by the two photosensors with the reference values predetermined in accordance with the difference of the reflectances of the right and wrong sides of the sheet to be used. For example, when the difference of the reflectances is larger than the largest level of the reference, it is judged that the difference between the reflectances detected by the two photosensors is larger than the difference between the reflectances of the right and wrong sides of the sheet to be used, so it means that the two reflection type photosensors respectively detect the reflectances of the two reflectors opposing each other, so that it is judged there is not fed a sheet (sheet absent state). When the difference of the reflectances detected by the two photosensors is smaller than the largest reference level, it is judged that there is fed a sheet (sheet present state) and the detected difference is compared with the reference values set in accordance with the kind and the right and wrong sides of the sheet, whereby the kind of the sheet and the right and wrong sides of the sheet are judged.

The features of the present invention which are believed to be novel are set forth with particularity in the appended claims. The present invention together with further objects and advantages thereof may best be understood with reference to the following detailed description, taken in conjunction with the accompanying drawings. However, it should be understood that the detailed description and specific examples, while indicating preferred embodiments of the invention, are given by way of illustration only, since various changes and modifications within the spirit and scope of the invention will become apparent to those skilled in the art from this detailed description.

The present invention will become more fully understood from the detailed description given hereinbelow and the accompanying drawings which are given by way of illustration only, and thus are not limitative of the present invention.

BRIEF DESCRIPTION OF THE DRAWINGS

FIGS. 1 to 6 are views for explaining a first embodiment of the present invention, wherein FIG. 1 is a schematic front view showing an image forming device employing the first embodiment of a sheet detecting device according to the present invention, FIGS. 2(A) and 2(B) are explanation views for explaining the constitution of the sheet detecting device, wherein FIG. 2(A) shows a state when the image receiving sheet does not reach to the sheet detecting device and FIG. 2(B) shows a state when the image receiving sheet reaches to the sheet detecting device, FIG. 3 is a block diagram showing a judging circuit of the sheet detecting device, FIG. 4 shows output signals of a reflection type photosensor S1 and the reference value $V_{th1}$ thereof, FIG. 5 shows output signals of a differential amplifier of the sheet detecting device and the reference values $V_{th2}$, $V_{th3}$ and $V_{th4}$ thereof, and FIG. 6 is a judgment table for the sheet detecting device.

FIGS. 7 to 10 are views for explaining a second embodiment of the present invention, wherein FIGS. 7(A) and 7(B) are explanation views for explaining the constitution of the sheet detecting device, wherein FIG. 7(A) shows a state when the image receiving sheet does not reach to the sheet detecting device and FIG. 7(B) shows a state when the image receiving sheet reaches to the sheet detecting device, FIG. 8 is a block diagram showing a judging circuit of the sheet detecting device, FIG. 9 shows output signals of a differential amplifier of the judging circuit and the reference values $V_{th1}$, $V_{th2}$, $V_{th3}$ and $V_{th4}$, and FIG. 10 is a judgment table for the sheet detecting device.

DETAILED DESCRIPTION OF THE PREFERRED EMBODIMENT

A first embodiment of a sheet detecting device of the present invention for use in an image forming device will be explained with reference to FIGS. 1 to 6.

In the image forming device, there is used a photosensitive mediative sheet having its surface coated with microcapsules containing light hardener and image forming materials and there is also used an image receiving sheet having its right surface coated with developer for coloring in reaction to the image forming materials and with thermoplastic resin materials.

Figure 1:
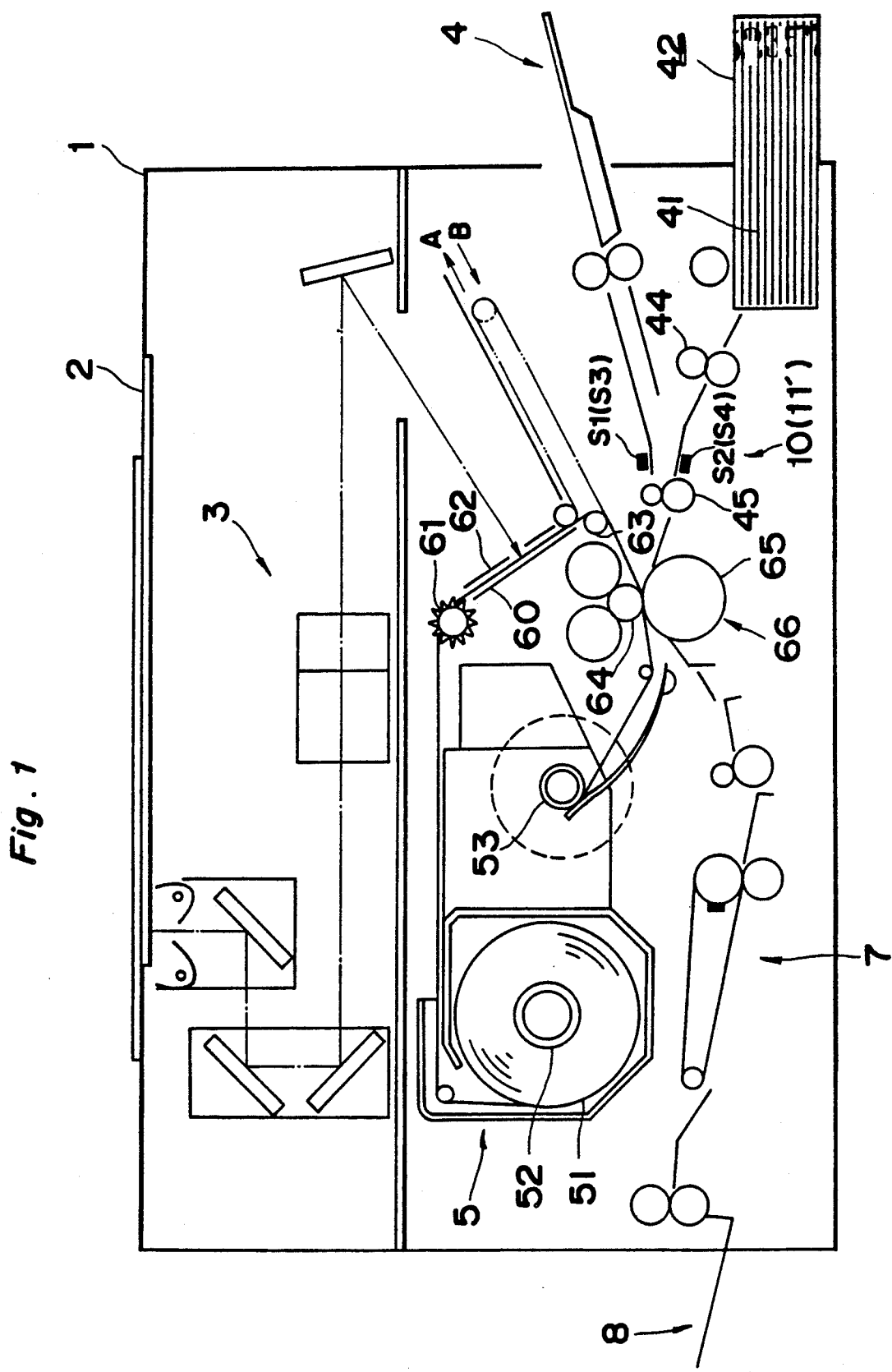

Referring to FIG. 1, there is arranged an original placing plate 2 on the top portion of an image forming device 1 and there is provided an optical system 3 including one or more light sources, reflecting mirrors and lenses below the original placing plate 2 in the upper portion of the image forming device 1. There is installed a mediative sheet cartridge 5 for accommodating a mediative sheet 51 below the optical system 3 in the left lower portion of the image forming device 1. There are arranged a tractor roller 61, exposure plate 60, sheet transfer plate 62 with a slit defined in the middle portion thereof, buffer roller 63 and a pair of pressing rollers 64 and 65 along a mediative sheet carrying path for carrying the mediative sheet from the sheet cartridge 5 through the exit thereof. The mediative sheet 51 is wound on a sheet feeding roll 52 and the other end portion of the mediative sheet 51 is carried along the carrying path so as to be wound up onto a sheet winding roll 53. In the right lower portion of the image forming device 1, there are provided a sheet feeding tray 4 for feeding an image receiving sheet and a sheet feeding cassette 42 for storing image receiving sheets 41. On a sheet carrying path for carrying the image receiving sheet 41 from the cassette 42 to a pressure developing roller 66, there are arranged a sheet feeding roller 44, sheet detecting device 10 (which is an embodiment of the present invention) and a timing roller 45. In the left side of the pressure developing portion 66, there is provided a glossing device 7 and there is provided a sheet exit tray 8 in the left side of the image forming device 1.

Next, an image forming operation of the image forming device 1 is explained. When an original document disposed on the original placing plate 2 is scanned by the optical system 3, the buffer roller 63 is shifted to the direction A and the reflection light reflected by the original document is applied onto the mediative sheet 51 located on the exposure plate 60 through the slit of the sheet transfer plate 62 so that the mediative sheet is exposed to the reflection light. By this exposure, there is formed a selective light hardener image on the mediative sheet 51. When the exposure is completed, the sheet winding roll 53 is rotated and the buffer roller 63 is shifted to the direction B so that the portion of the mediative sheet 51 on which the selective hardener image is formed is transferred to the pressure developing portion 66. On the other hand, the image receiving sheet 41 is fed out of the cassette 42 one by one so as to be transferred to the sheet detecting device 10 through the sheet feeding roller 44. After presence or absence, the kind and the right side or wrong side of the sheet 41 is detected, the sheet is transferred to the timing roller 45 where the sheet 41 is once stopped and waits for a timing. After the buffer roller 63 is started to be shifted to the direction B, the sheet 41 waiting at the timing roller 45 is fed to the pressure developing portion 66 together with the selective hardener image formed on the mediative sheet 51.

The mediative sheet 51 and the image receiving sheet 41 are fitted together with each other and the fitted sheets 41 and 51 are passed between the pressing rollers 64 and 65. The microcapsules which are not hardened on the mediative sheet 51 are broken so that the image forming materials contained in the microcapsules flow out and react to the developer for coloring coated on the image receiving sheet 41. After performing the pressure developing process of the sheets 41 and 51 through the pressure developing portion 66, the processed mediative sheet 51 is wound up on the sheet winding roll 53, and the processed image receiving sheet 41 is transferred to the glossing device 7 to be heat-treated, thereafter the image receiving sheet 41 is discharged to the sheet exit tray 8.

Figure 2A:
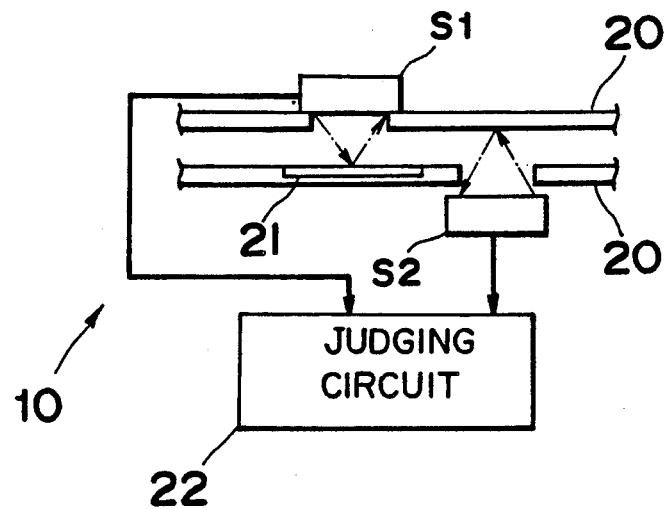
Figure 2B:
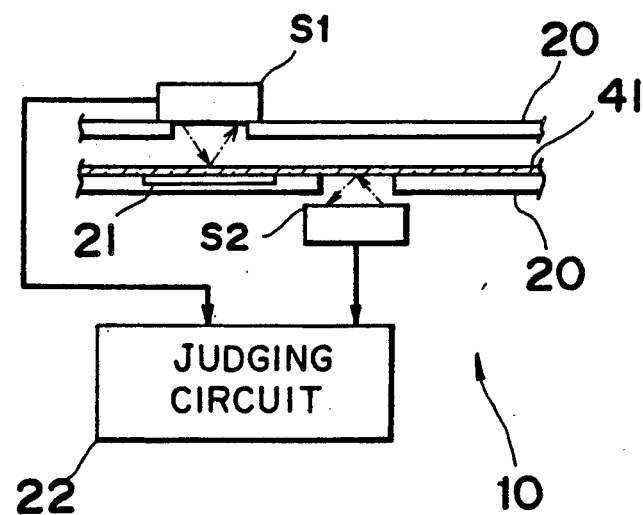

As shown in FIGS. 2(A) and 2(B), there are arranged reflection type photosensors S1 and S2 respectively on guide members 20 provided on both sides of the sheet carrying path between the sheet feeding roller 44 and the timing roller 45. On the surface of the guide member 20 facing to the reflection type photosensor S1, there is provided a reflector 21 which is made of such materials having a reflectance smaller than any of the reflectances of the right and wrong side of the image receiving sheet to be used. The reflection type photosensors S1 and S2 are connected to a judging circuit unit 22 so that the presence or absence, the kind and the right or wrong side of the image receiving sheet is judged as to be described later. In FIG. 2(A), since the image receiving sheet 41 is not fed to the position between the reflection type photosensors S1 and S2 of the sheet detecting device 10, the reflection type photosensor S1 detects the reflectance of the reflector 21 facing to the photosensor S1. In FIG. 2(B), since the image receiving sheet 41 is fed to the position between the reflection type photosensors S1 and S2 of the sheet detecting device 10, the reflection type photosensor S1 detects the reflectance of the right side of the image receiving sheet 41 and the reflection type photosensor S2 detects the reflectance of the wrong side of the image receiving sheet 41.

In the judging unit 22, only the output of the reflection type photosensor S1 is compared with the reference value when the image receiving sheet is not present, thereby judging that the image receiving sheet is present. And then, the difference between the output values of the reflection type photosensors S1 and S2 is compared with second and third reference values corresponding to the kind of the sheet and to the difference between the reflectances of the right and wrong sides of the sheet, thereby judging the kind and the right or wrong side of the image receiving sheet 41.

Accordingly, in the case as shown in FIG. 2(A), since the output of the reflection type photosensor S1 is smaller than the first reference value, it is judged that an image receiving sheet is not present. In the case as shown in FIG. 2(B), the difference between the output values of the reflection type photosensors S1 and S2 is compared with the respective second and third reference values, so that the kind and the right and wrong sides of the image receiving sheet are judged.

Figure 3:
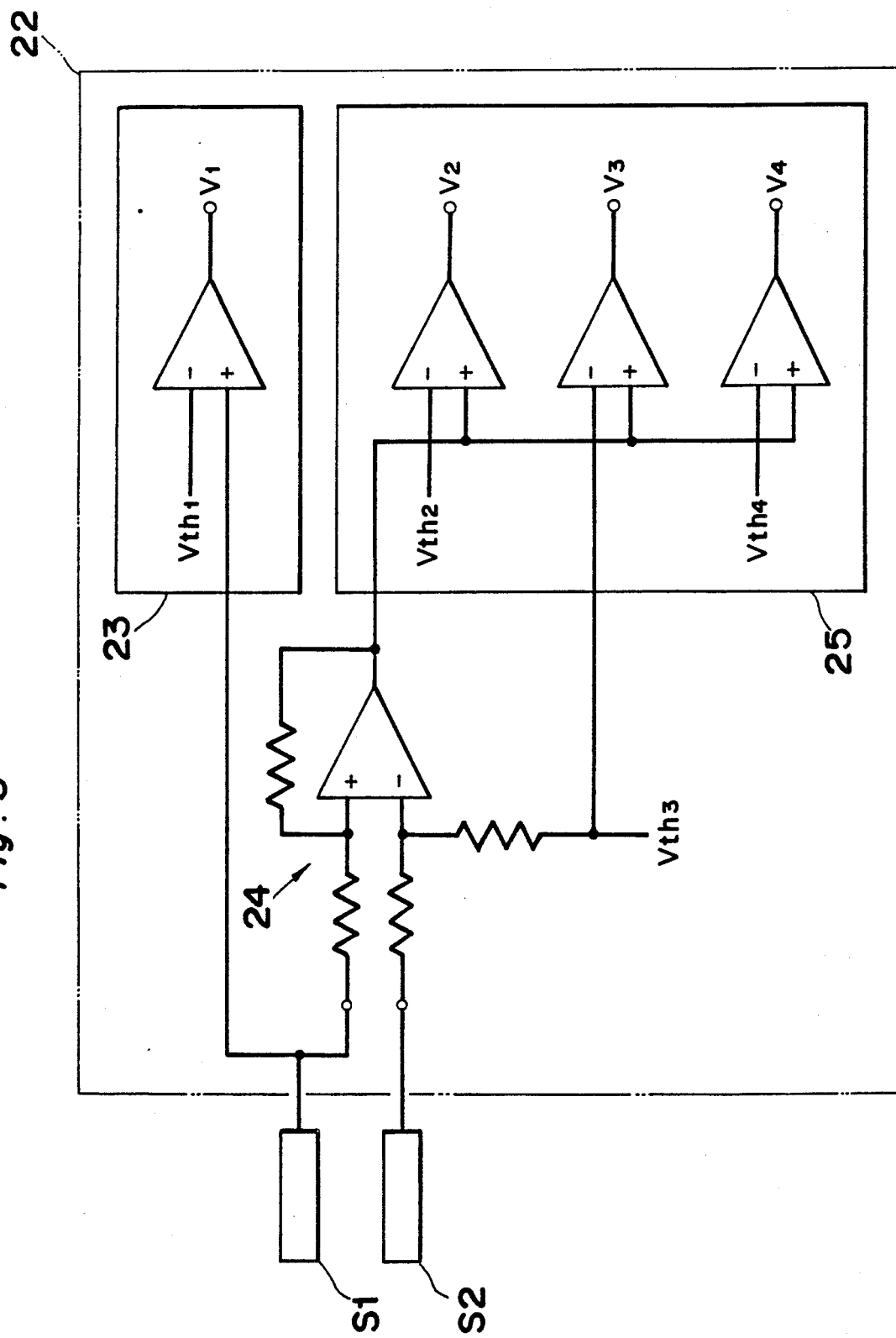

As shown in FIG. 3, the judging unit 22 comprises a comparator 23 in which the output signal of the reflection type photosensor S1 is directly entered so as to be compared with the first reference value $V_{th1}$ for judging the presence or absence of the image receiving sheet, and comprises a differential amplifier 24 in which the output signals of the reflection type photosensors S1 and S2 are both entered so as to be processed in order to facilitate the comparison in the subsequent process, another comparator 25 in which the output signal of the differential amplifier 24 is compared with the reference values $V_{th2}$, $V_{th3}$ and $V_{th4}$ corresponding to the difference between the reflectances of the right and wrong sides of two kinds of the image receiving sheet such as sheet A and B in this example so that the kind and the right and wrong sides of the sheet are judged. For example, when the image receiving sheet is not fed in the sheet detecting device 10, the reflection type photosensor S1 detects a very small reflectance of the reflector 21 and the output signal $V_1$ is smaller than the first reference value $V_{th1}$, thereby judging the image receiving sheet is absent.

FIG. 4 shows the output signal of the reflection type photosensor S1 of the sheet detecting device 10 and the first reference value $V_{th1}$ thereof, and by setting the first reference value $V_{th1}$ as shown in FIG. 4, the presence or absence of the image receiving sheet can be detected.

FIG. 5 shows the output signal of the differential amplifier provided in the judging circuit 22 of the sheet detecting device and the second, third and fourth reference values $V_{th2}$, $V_{th3}$ and $V_{th4}$ thereof. The reference values $V_{th2}$, $V_{th3}$ and $V_{th4}$ are set in accordance with the difference between the reflectances of the right and wrong sides of the two kinds of sheet A and B. By comparing the respective output signals $V_2$, $V_3$ and $V_4$ of the comparator 25 with the reference values $V_{th2}$, $V_{th3}$ and $V_{th4}$, the kind and the right and wrong sides of the sheet can be judged.

FIG. 6 shows a judging table when using the sheet detecting device for judging the presence or absence, the kind and the right and wrong sides of the image receiving sheet according to the output logics of the comparators 23 and 25.

That is to say, it is judged in such a manner that; when the output $V_1$ is low level, the sheet is absent; when the outputs $V_1$, $V_2$, $V_3$ and $V_4$ are high level, the right side of the sheet A is set; when the outputs $V_1$, $V_3$ and $V_4$ are high level and $V_2$ is low level, the right side of the sheet B is set; when the outputs $V_1$ and $V_4$ are high level and the outputs $V_2$ and $V_3$ are low level, the wrong side of the sheet B is set; and when the output $V_1$ is high level and the outputs $V_2$, $V_3$ and $V_4$ are low level, the wrong side of the sheet A is set.

In the present embodiment, although there are used two kinds of image receiving sheet, it is not limited to this and there can be used more than two kinds of sheet by increasing the number of the comparators according to the kinds of the sheet.

Next, a second embodiment of the sheet detecting device according to the present invention will be explained with reference to FIGS. 7 to 10.

The substantial structure of the image forming device employing the sheet detecting device of the present invention is similar to that in the first embodiment of the present invention except the sheet detecting device 10 and the reflection type photosensors S1 and S2 shown in FIG. 1 are replaced by a sheet detecting device 11 and by reflection type photosensors S3 and S4 respectively.

Figure 7A:
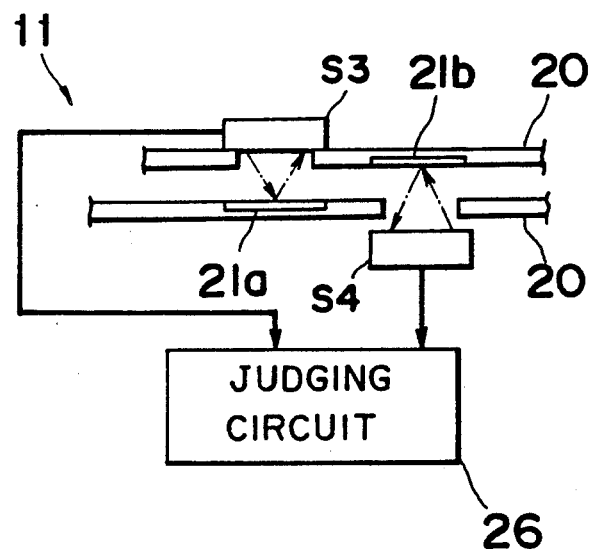
Figure 7B:
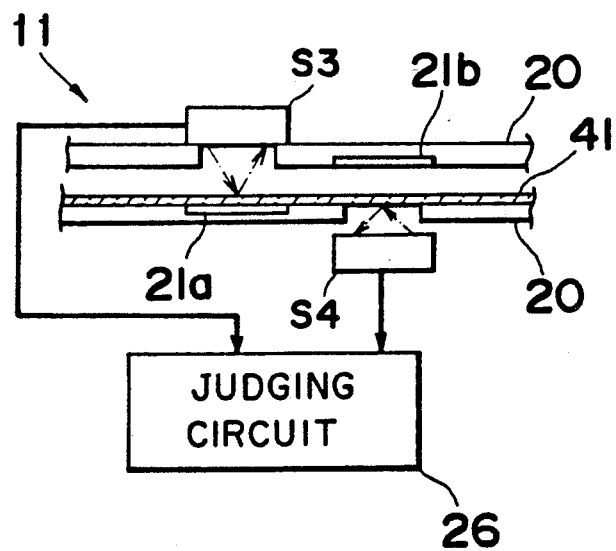

FIGS. 7 show a constitution of the sheet detecting device, wherein FIG. 7(A) shows a state when the image receiving sheet is not fed in the sheet detecting device and FIG. 7(B) shows a state when the image receiving sheet is fed in the sheet detecting device.

There are arranged reflection type photosensors S3 and S4 on the guide members 20 on both sides of the sheet carrying path between the sheet feeding roller 44 and the timing roller 45 in the image forming device. There are provided a reflector 21a on the surface facing to the reflection type photosensor S3 and a reflector 21b on the surface facing to the reflection type photosensor S4. The reflectors 21a and 21b are made of materials having such reflectances that the difference between the reflectances of the reflectors 21a and 21b is larger than the maximum of the differences between the reflectances of the right and wrong sides of some kinds of image receiving sheet to be used. The reflection type photosensors S3 and S4 are connected to a judging circuit unit 26 so that the presence or absence and the kind and the right side or wrong side of the image receiving sheet can be judged as to be described later. In FIG. 7(A), since the image receiving sheet 41 is not fed in the portion between the reflection type photosensors S3 and S4 of the sheet detecting device 11, the reflection type photosensor S3 detects the reflectance of the reflector 21a facing thereto and the reflection type photosensor S4 detects the reflectance of the reflector 21b facing thereto. In FIG. 7(B), since the image receiving sheet 41 is fed in the portion between the reflection type photosensors S3 and S4 of the sheet detecting device 11, the reflection type photosensor S3 detects the reflectance of the right side of the image receiving sheet 41 and the reflection type photosensor S4 detects the reflectance of the wrong side of the image receiving sheet 41.

In the judging unit 26, the presence or absence, the kind and the right or wrong side of the image receiving sheet can be judged on the basis of the difference between the output signals of the reflection type photosensors S3 and S4 as follows.

Figure 8:
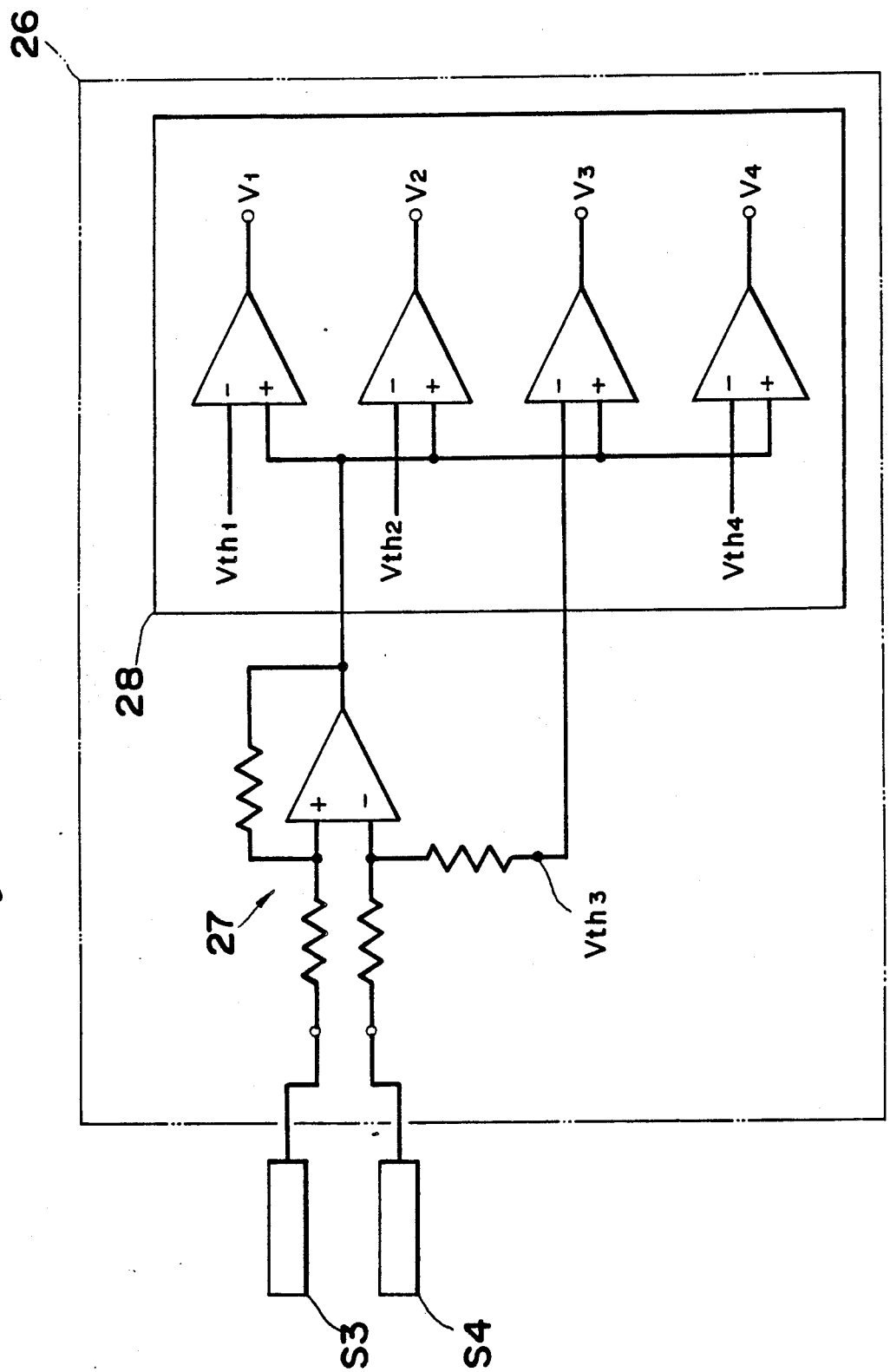

FIG. 8 shows the judging circuit of the sheet detecting device. As shown in FIG. 8, the judging circuit 26 comprises a differential amplifier 27 for processing the output signals of the reflection type photosensors S3 and S4 so as to facilitate the comparison in the subsequent step, and comprises a comparator 28 for judging the presence or absence, the kind and the right side or wrong side of the image receiving sheet by comparing the output signals of the differential amplifier 27 with the reference values $V_{th1}$ to $V_{th4}$ set in accordance with the differences between the reflectances of the right sides and the wrong sides of two kinds of image receiving sheet. For example, when the image receiving sheet 41 is not fed in the sheet detecting device 11, the difference between the reflectances of the reflectors 21a and 21b detected by the reflection type photosensors S3 and S4 respectively is so large that the output signals $V_1$ to $V_4$ of the comparator 28 are higher than the reference values $V_{th1}$ to $V_{th4}$, whereby it is judged that the image receiving sheet is absent.

Figures 9, 10:
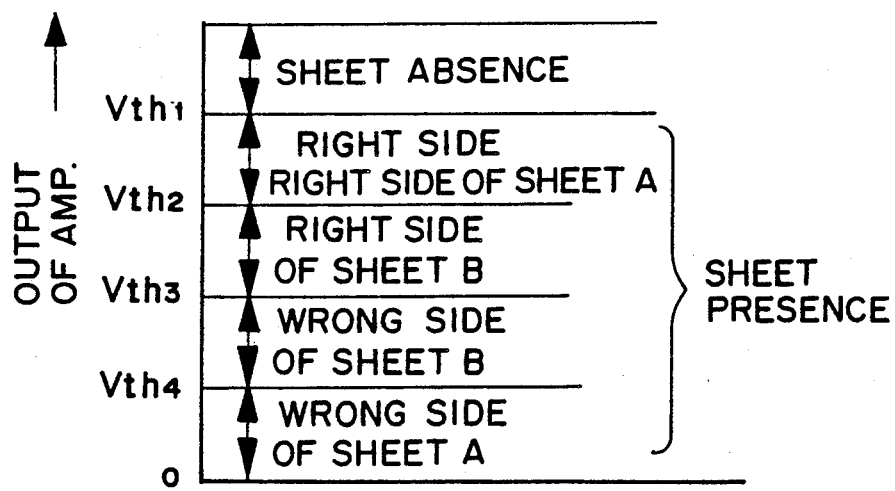

FIG. 9 shows the output signal of the differential amplifier 27 and the reference values $V_{th1}$ to $V_{th4}$ set in accordance with the differences between the reflectances of the right and wrong sides of the two kinds of sheet A and B respectively, wherein the presence or absence, the kind and the right or wrong side of the image receiving sheet can be judged by comparing the output signals $V_1$ to $V_4$ of the comparator 28 with the reference values $V_{th1}$ to $V_{th4}$ respectively.

FIG. 10 shows a judging table for use in the sheet detecting device for judging the information of the image receiving sheet based on the output logic of the comparator. That is to say, when the output signals $V_1$ to $V_4$ are all high level, it is judged that the image receiving sheet is not present; when the output signal $V_1$ is low level and the output signals $V_2$ to $V_4$ are high level, it is judged the right side of the sheet A is set; when $V_1$ and $V_2$ are low level and $V_3$ and $V_4$ are high level, it is judged the right side of the sheet B is set; when $V_1$ to $V_3$ are low level and $V_4$ is high level, it is judged the wrong side of the sheet B is set; and when $V_1$ to $V_4$ are all low level, it is judged the wrong side of the sheet A is set.

In this example, although there are used two kinds of image receiving sheet, it is not limited to this and there may be used more than two kinds of image receiving sheet by adding the comparators in accordance with the kinds of the image receiving sheet.

As described above, according to the present invention, by adding a device to the conventional sheet detecting device for detecting the kind and the right or wrong side of the sheet, it becomes possible to judge the presence or absence of the sheet as well as the judgment of the kind and the right or wrong side of the sheet. That is to say, in the first embodiment of the present invention, the presence or absence of the sheet can be judged by detecting the small reflectance of the reflector under the condition that the sheet is absent, and in the second embodiment of the present invention, when the sheet is not present, the difference between the reflectances of two reflectors larger than any difference between the reflectances of the right and wrong sides of the sheet to be used is detected, whereby it is judged whether the sheet is present or absent.

Accordingly, complication of the sensors can be avoided and the number of the parts thereof can be reduced, resulting in reducing the cost and the space thereof.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A sheet detecting device for obtaining information of one or more kinds of sheet to be fed in said sheet detecting device along a sheet carrying path having upper and lower guide members for guiding said sheet one by one, said upper and lower guide members having sides and the sheet detecting device comprising:
   a pair of detecting means for detecting difference between reflectances of a right side and a wrong side of said sheet, provided in both sides of said guide members respectively;
   a reflector member having a reflectance smaller than a minimum of the reflectances of the right side and wrong side of said sheet to be fed in the sheet detecting device, the reflector member being provided in any one of said guide members facing to one of said detecting means; and
   judging means for judging the presence or absence of said sheet to be fed in the sheet detecting device based on an output signal of said one of detecting means facing said reflector member and judging the kind and the right or wrong side of said sheet fed in the sheet detecting device based on the difference between output signals of said pair of detecting means.

2. The sheet detecting device as defined in claim 1, wherein said detecting means are composed of reflection type photosensors.

3. The sheet detecting device as defined in claim 1, wherein said judging means comprises comparator means for comparing the output signal of said one of detecting means facing to said reflector member with a predetermined reference value set when a sheet fails to be fed in the sheet detecting device.

4. A sheet detecting device for obtaining information of one or more kinds of sheet to be fed in said sheet detecting device along a sheet carrying path having upper and lower guide members for guiding said sheet one by one, said upper and lower guide members having sides and the sheet detecting device comprising:
   a pair of detecting means for detecting difference between reflectances of a right side and a wrong side of said sheet, provided in both sides of said guide members respectively;
   a pair of reflector members having reflectances different from each other provided in both of said guide members facing to said detecting means respectively, the difference between the reflectances of said pair of reflector members being made larger than a maximum of the differences between the reflectances of the right side and wrong side of said sheet to be fed in the sheet detecting device; and
   judging means for judging the presence or absence, the kind and the right or wrong side of said sheet based on the difference between output signals of said pair of detecting means.

5. The sheet detecting device as defined in claim 4, wherein said detecting means are composed of reflection type photosensors.

6. The sheet detecting device as defined in claim 4, wherein said judging means comprises a differential amplifier for processing the output signals of said detecting means and a comparator means for comparing output signals of said differential amplifier with predetermined reference values set on the basis of the differences between the reflectances of the right and wrong sides of said various kinds of sheet to be fed.

* * * * *